United States Patent [19]
Kuwano

[11] Patent Number: 5,861,667
[45] Date of Patent: Jan. 19, 1999

[54] SINGLE END IN OUT ARRANGEMENT

[75] Inventor: Hiro Kuwano, Plano, Tex.

[73] Assignee: Texas Instruments Incorporated, Dallas, Tex.

[21] Appl. No.: 840,126

[22] Filed: Mar. 11, 1997

[51] Int. Cl.⁶ .................................................. H01L 23/52
[52] U.S. Cl. .......................................... 257/691; 257/782
[58] Field of Search ..................... 257/691, 777, 257/774, 773, 782

[56] References Cited

U.S. PATENT DOCUMENTS 5,455,723 10/1995 Boutaghou .
5,465,186 11/1995 Bajorek .
5,488,518 1/1996 Shier .
5,499,149 3/1996 Dovek .
5,616,954 4/1997 Tobase ..................................... 257/691

Primary Examiner—Tom Thomas
Assistant Examiner—Roy Potter
Attorney, Agent, or Firm—W. Daniel Swayze, Jr.; Wade James Brady, III; Richard L. Donaldson

[57] ABSTRACT

An integrated circuit 200 includes a ground plane 100 being positioned between the integrated circuit 200 and a flex. The ground plane includes projections for defining a recess in a ground plane of the integrated circuit for connection with a plurality of external devices, where each of the external devices are grounded to the ground plane through the projections.

5 Claims, 3 Drawing Sheets

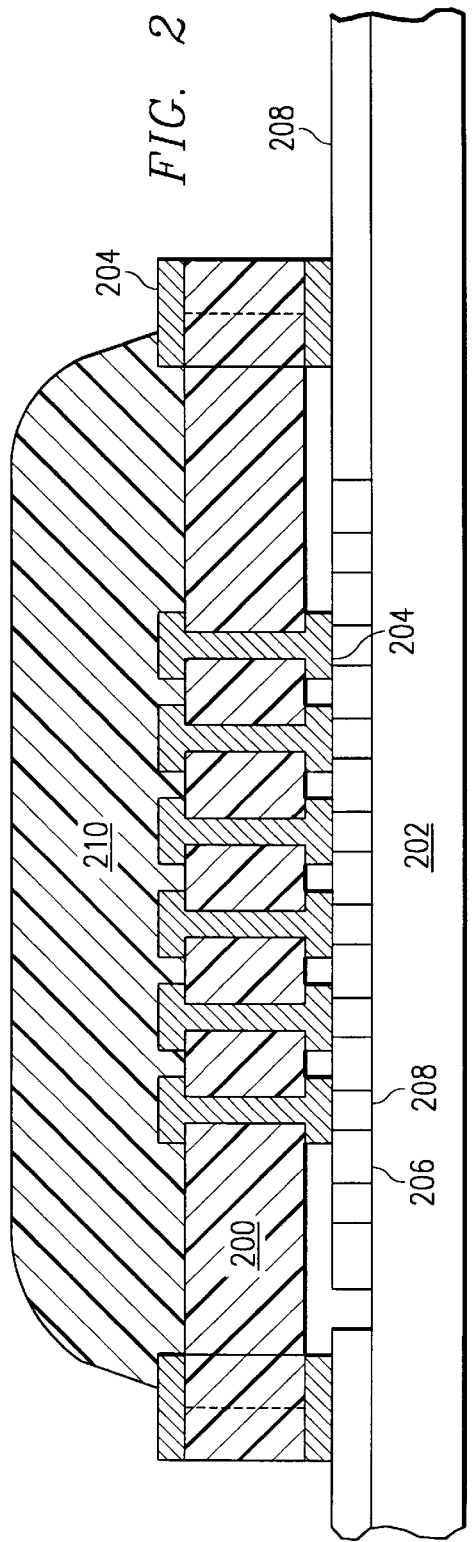
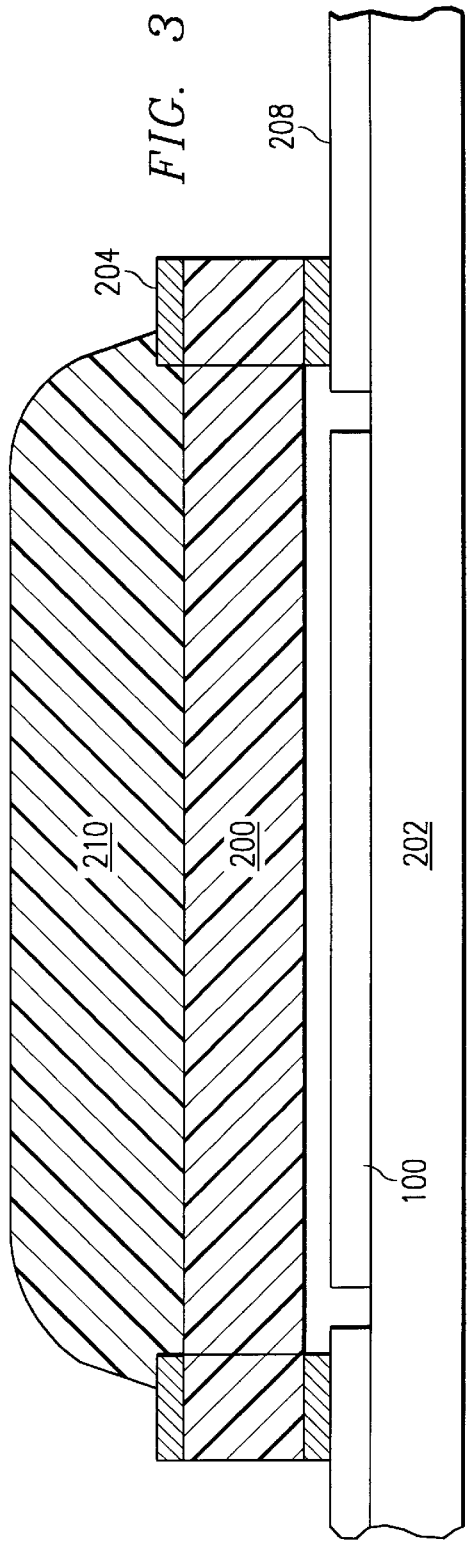

SINGLE END IN OUT ARRANGEMENT

TECHNICAL FIELD OF THE INVENTION

The present invention relates to integrated circuits, and more particularly to integrated circuits used in conjunction with a data storage system having at least one magnetic disk.

BACKGROUND OF THE INVENTION

Magnetic disc drives have read/write heads which are used for both writing data to a magnetic disc and reading data from the magnetic disc. During a write operation, a write signal is provided to a selected read/write head from a write control circuit. The write signal represents data to be encoded onto the magnetic disc. More particularly, the read/write head receives encoded digital data from a "channel" chip. The transitions of the signal received from the channel chip cause the write current flowing within the read/write head to reverse direction which, in turn, induces a flux reversal in the magnetized material of the medium.

During a read operation, the read/write head senses flux reversals from the magnetic disc. The flux reversals are encoded onto the magnetic disc during the write operation. Based on the flux reversals, the read/write head provides a read signal to a read channel. The read circuit amplifies the read signal, and the channel circuit recovers the data. The read circuit then provides the data to a magnetic disc controller for further processing.

Each magnetic disc in a disk drive has a corresponding "head" adjacent to the top and bottom surfaces of the disc. Thus, there are two N heads per stack where N equals the number of disks in a drive. Normally, only one head is active at any given time. Thus, for each head, there may be a plurality of connectors for either providing a read or write function. For example, one head may require four connections, namely a ground wire, a read wire, and a pair of write wires.

Normally, the ground wire is connected through a pin out. However, this arrangement increases the size of the pin out arrangement. This reduces the ability of the package to mount on the actuator area.

SUMMARY OF THE INVENTION

By the present invention, a system and apparatus is provided to provide for a common ground for all the ground wires of external devices or multiple head devices. Additionally, the present invention provides an advantageous pin out arrangement that advantageously places ground wires or traces adjacent to a common connection to the common ground. By this pin out arrangement, space is saved by eliminating connection points to a common ground plane.

The present invention includes an integrated circuit including a substrate, a ground plane having a surface substantially parallel to a surface of the substrate, and the ground plane having a direct connection for a connection external to the substrate. The ground plane may have projections for the direct connection. The ground plane may have a recess defined by the projections so there is sufficient space for connection to a circuit on the substrate of the ground plane, so that the projections are close to the connection of the ground plane. The ground plane may be rectangular in shape. Additionally, the ground plane may have a recess to make connections for at least two external devices. Each of the at least two external devices are directly connected to the ground plane by the projections which defines the recess. The ground plane may have at least two recesses for connection to internal circuits formed on the substrate. Each of the recesses are defined by projection of the ground plane.

This arrangement allows the integrated circuit to be mounted in the actuator area, where the available area is small. The projection eliminates the need for a separate pin out, saving space.

BRIEF DESCRIPTION OF THE DRAWINGS

FIG. 2 illustrates an end view IC and a cross-section of the flex of the present invention;

FIG. 3 illustrates a cross-sectional view the flex and IC of the present invention;

DETAILED DESCRIPTION OF ILLUSTRATIVE EMBODIMENTS

Figure 1:
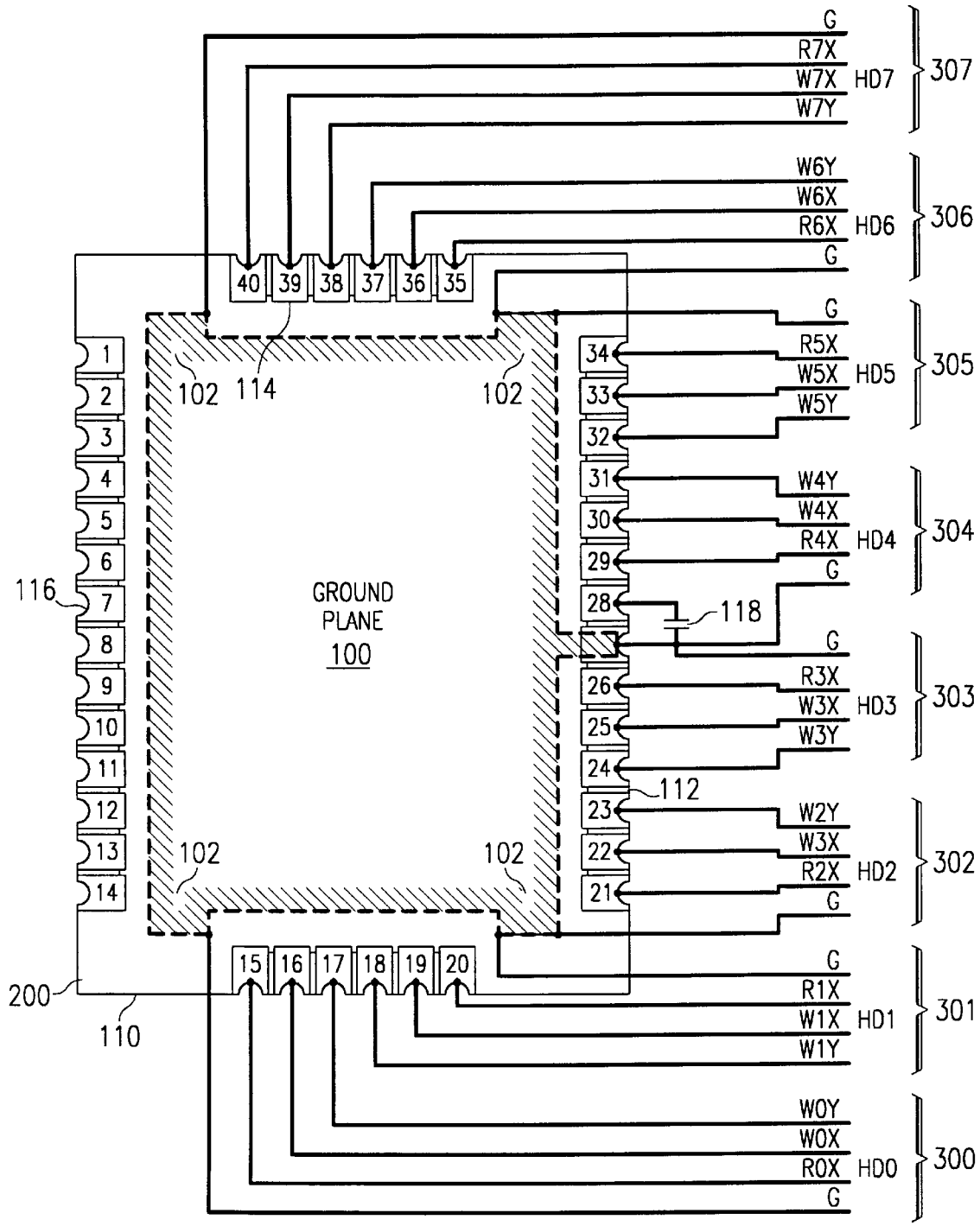
FIG. 1 illustrates a top view of the ground plane and integrated circuit chip with pin out arrangement of the present invention.

FIG. 1 illustrates the integrated circuit 200 and ground plane 100. Additionally, FIG. 1 illustrates a pin out arrangement for connection to an external device external to the integrated circuit 200, for example, at least one head and for connection to a control circuit formed on the integrated circuit 200. Along one side 110 of the integrated circuit is the pin out arrangement for two external devices, for example, head 300 and head 301. The three left-most pins are for connection to the read trace R0X, the first write trace W0X and the last write trace W0Y of head 300 at pin out 15, 16 and 17, respectively. The ground trace of head 300 is connected to the vertical extended projection 102 of the ground plane 100. The next three connections to pin outs are for head 301. The order of traces for another external device or head 301 is reversed or opposite then that of head 300. Since, the trace W1Y should be center most so that the ground trace can be directly connected to the vertical projection 102 of ground plane 100. The traces for W1Y, W1X and R1X are connected to pin outs 18, 19 and 20, respectively. Next, heads 302–305 are connected along a longitudinal side 112 of the IC. Like heads 300 and 301, heads 302 and 305 are reversed or opposite in order so that two respective ground traces are adjacent to a different vertical extended projection 102. For head 302, the R2X, W2X and W2Y traces are connected to pin outs 21, 22 and 23, respectively. Furthermore, the center-most heads 303 and 305 have the ground traces directly adjacent to and for connection to horizontal portion 106 of the ground plane 100. Concerning head 303, the two write traces W3Y and W3X are connected to pins 24 and 25, respectively, while the read trace R3X is connected to pin 26. The ground trace of head 303 and the ground trace of head 304 are connected together to the horizontal portion 106 of the ground plane 100. The read trace R4X and two write traces W4X and W4Y are connected to pins 29, 30 and 31, respectively.

With respect to head 305, since the traces associated with this head are adjacent to the vertical projection 102, the two write traces W5Y and W5X are connected to pin outs 32 and 33, respectively, while the read trace is connected to pin out 34. The ground is connected to vertical projection 102 of the ground plane 100.

Concerning heads 306 and 307, these are connected in a similar fashion to heads 301 and 300, respectively to pin outs. Specifically, the ground trace of head 306 is connected to the vertical projection 102 while the read and two write traces R6X, W6X and W6Y, respectively are connected to pins 35, 36 and 37, respectively.

Concerning head 307, the two write traces and read trace W7Y, W7X and R7X are connected to pins 38, 39 and 40, respectively, while the ground trace is connected to the vertical extended projection 102. As illustrated in FIG. 1, the ground plane has a surface substantially parallel to the bottom surface of the integrated circuit 200. The vertically extended projections 102 define a recess 120 in the ground plane for the pin outs at the opposite sides of the ground plane. These recesses are not necessarily required. Additionally, the horizontal projection 106 protrudes from the horizontal side. Together with vertical projection 102, the horizontal projection 106 defines a recess 120 in the substrate.

FIG. 1 Illustrates that four heads 302–305 are connected to pins 21–34 along the longitudinal axis 112 of the integrated circuit. However, additional horizontal projections 106 could be added to the longitudinal portion allowing additional heads and corresponding traces to be connected to additional pin outs. Further, horizontal projections may be added to the opposite longitudinal portion 116 of the ground plane. The capacitance 118 is connected between pin out 28 and the horizontal extended projection 106 to reduce noise. Pin outs 1–14 positioned along longitudinal portion 116 are for traces to controller (not shown).

FIG. 2 illustrates a side view of the integrated circuit 200 of FIG. 1. The substrate 200 is positioned over the FLEX 202 and electrically interconnects with the heads through traces 208. Between the traces 208 are insulated regions 206 to insulate the individual traces 208. The pin out connections are formed through the substrate by first forming the substrate, and then forming a thru hole by etching through the substrate or any other appropriate method. Next, the hole is metalized and the surface around the hole is plated. The chips are placed on the substrate and the substrate is scribed along the scribe lines. Next, the encapsulating material 210 is placed over the surface of the substrate and chips for protection. Other types of packages, such as small outline quad flat packages (SQFP), may be used with equally advantageous results.

FIG. 3 illustrates a side cut away view of the ground plane 100 sandwiched between the substrate and flex.

Figure 4:
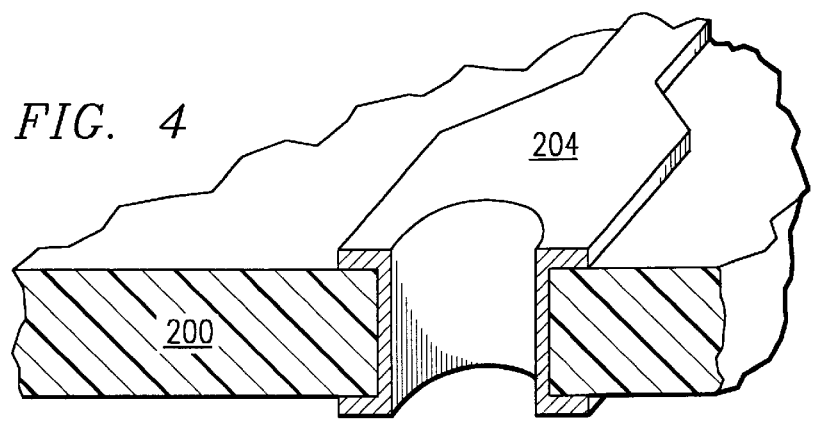
FIG. 4 illustrates a pin out for interconnection with a trace.

FIG. 4 illustrates a connector or pin out for a trace.

Figure 5:
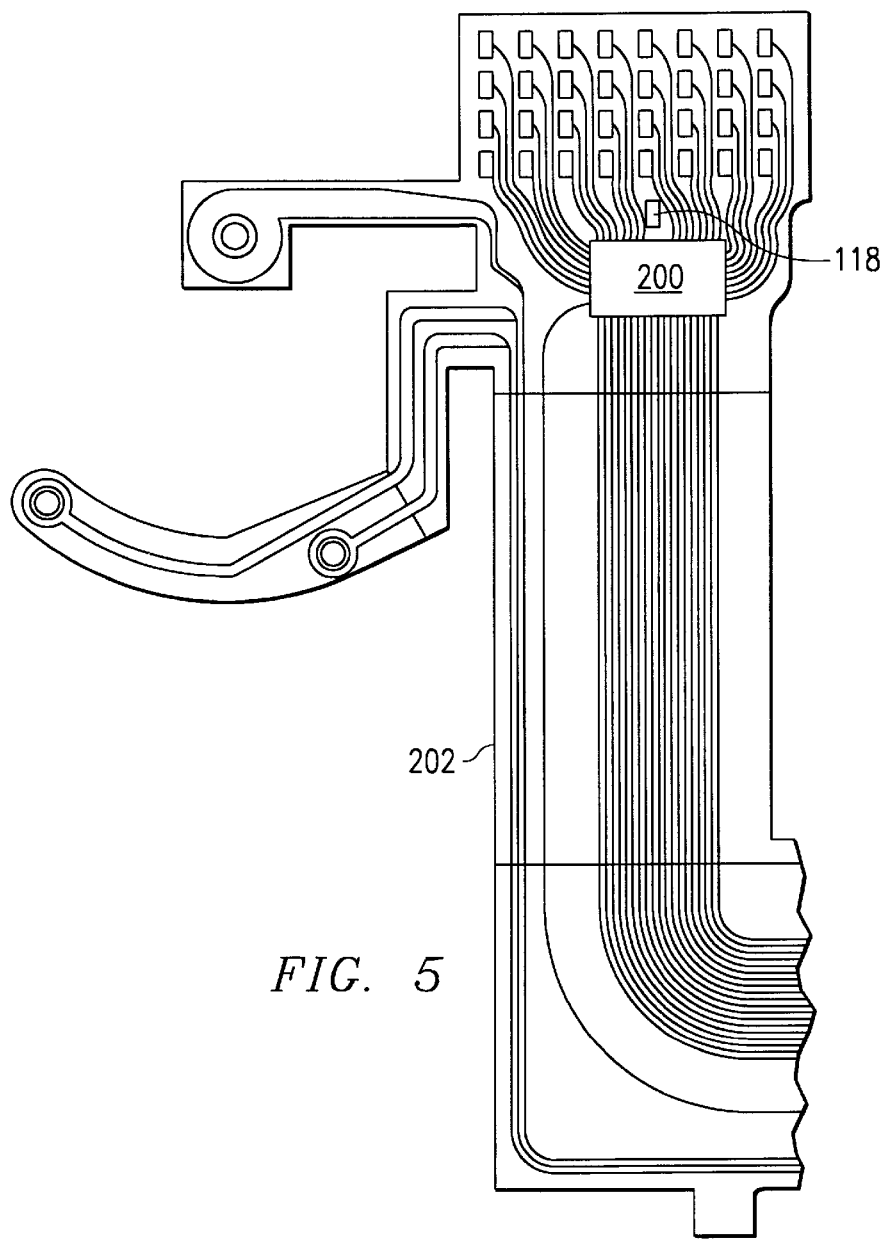
FIG. 5 illustrates an example of a flex.

As illustrated in FIG. 5, the flexible cable (flex) 202 provides electrical connection between the magnetic head (not shown) to the actuator (not shown). The flex cable 202 includes conductors or traces connected to termination points for connection to external circuitry, for example, heads for connection to the control circuit formed on substrate 200. The flex cable 202 may be formed on a laminated layer of flexible polymide material with the various conductors and pads formed of CU or other suitable materials embodied within the polymide layer.

Terminations of the flexible cable can be made through windows formed though the polymide layer adjacent to the termination pads.

Although the present invention has been described with reference to preferred embodiments, workers skilled in the art will recognize that changes may be made in form and detail without departing from the spirit and scope of the invention.

What is claimed:

1. An integrated circuits comprising:

a substrate;

a ground plane coupled to said substrate having a surface substantially parallel to a surface of said substrate; and said ground plane being directly connected to an external circuit external to said substrate, and wherein said ground plane has a recess for connection to a circuit formed on said substrate and defined by projections of said ground plane.

2. An integrated circuit as in claim 1, wherein said ground plane has a projection for said direct connection.

3. An integrated circuit as in claim 1, wherein said ground plane includes said recess to include connections for at least two external devices and being defined by projections of said ground plane; and each of said at least two external devices being directly connected to said ground plane by said projections.

4. An integrated circuit as in claim 3, wherein said substrate including said recesses included connection for at least three external devices; and each of said three external devices being directly connected by said projections.

5. An integrated circuit as in claim 1, wherein said ground plane has at least two recesses for connection to internal circuit formed on said substrate; and each of said recesses being formed by projections of said ground plane.

* * * * *